United States Patent [19]

Crawford

[11] Patent Number: 5,311,353
[45] Date of Patent: May 10, 1994

[54] WIDE DYNAMIC RANGE OPTICAL RECEIVERS

[75] Inventor: Ian D. Crawford, Longwood, Fla.

[73] Assignee: Analog Modules, Longwood, Fla.

[21] Appl. No.: 27,276

[22] Filed: Mar. 5, 1993

[51] Int. Cl.⁵ .............................................. H01J 40/14
[52] U.S. Cl. ..................... 359/333; 359/189; 359/194
[58] Field of Search ....................... 359/189, 194, 333

[56] References Cited

U.S. PATENT DOCUMENTS

| | | | |
|---|---|---|---|
| 4,721,385 | 1/1988 | Jelalian et al. | 356/5 |
| 4,723,313 | 2/1988 | Folcke et al. | 455/619 |
| 4,792,230 | 12/1988 | Naganuma et al. | 356/345 |
| 4,812,035 | 3/1989 | Freedman et al. | 356/5 |
| 4,830,486 | 5/1989 | Goodwin | 356/5 |
| 4,846,571 | 7/1989 | Jelalian et al. | 356/5 |
| 4,856,893 | 8/1989 | Breen | 356/5 |
| 5,012,202 | 4/1991 | Taylor | 359/194 |
| 5,202,553 | 4/1993 | Geller | 359/189 |

Primary Examiner—Mark Hellner
Attorney, Agent, or Firm—Gerald E. Linden

[57] ABSTRACT

A wide-dynamic range optical receiver amplifier is provided by using two separate amplifiers. The first amplifier is a low-impedance input, low-noise, high-gain amplifier, preferably a transresistance amplifier. An input resistor is chosen for the amplifier such that its resistance value is much greater than the input impedance of the first amplifier, resulting in insignificant change in input impedance when the first amplifier's output becomes saturated. A light-induced signal source is connected to the input resistor such that signal current from the light-induced signal source flows through the input resistor into the first amplifier input. A second high-input-impedance amplifier (preferably an FET-input buffer amp) is connected to receive the light induced signal source, either directly or through a resistive divider network. The difference in gain between the two amplifiers serves to extend the dynamic range of the optical receiver amplifier without switching input or feedback components, and without discontinuous response as the first amplifier becomes saturated. Other embodiments are directed to a further diode induced breakpoint, and to a front-end for a spot tracking system.

42 Claims, 2 Drawing Sheets

WIDE DYNAMIC RANGE OPTICAL RECEIVERS

TECHNICAL FIELD OF THE INVENTION

The invention relates to optical receivers. and more particularly to the detection and amplification of wide dynamic range signals from photosensitive detectors.

BACKGROUND OF THE INVENTION

Optical receivers (or opto-receivers) measure light used in various applications such as atmospheric studies, laser rangefinding, and spot tracking. In many applications it is desirable to utilize the value of light flux over a wide dynamic range. For example, a target tracking (spot-tracking) device may provide directional information to a target by means of splitting a light spot reflected off of a target between four quadrants of a multi-sector photodetector. The distribution of light between the four quadrants of the photodetector provides an indication of how far "off-center" the detector is aimed. The light flux varies over a wide dynamic range as the tracker approaches the target, yet measurements must be taken.

The requisite wide-dynamic range has been achieved in the past by using gain-switched or logarithmic amplifiers. These designs are complex and difficult to implement without increasing the preamplifier noise. Further, these designs may be bulky and large, making them less desirable for use in airborne applications where size and weight are of paramount importance.

The following patents, incorporated by reference herein, generally disclose detecting and/or measuring light, especially laser light: U.S. Pat. Nos. 4,792,230 (measuring ultra-short optical pulses); 4,721,385 (FM-CW laser radar system); 4,830,486 (frequency modulated laser radar); 4,856,893 (which discloses both CW and pulse lasers, as well as range measurement); 4,812,035 and 4,846,571 (AM-FM laser radar).

DISCLOSURE OF THE INVENTION

It is therefore an object of the present invention to provide an improved wide-dynamic range amplifier for an optical receiver.

It is another object of the present invention to provide a low-noise high-gain amplifier (preamplifier) which can automatically handle large input signals without switching sensitive input circuits, (i.e., with fixed input circuitry).

It is a further object of the invention to provide a wide-dynamic range optical receiver amplifier with fixed feedback circuitry, i.e., without switching feedback components around the amplifier.

It is a further object of the invention to provide a multi-ranging optical receiver amplifier without feedback or input circuitry switching.

It is a further object of the invention to accomplish the above objects in a manner which minimizes the circuit complexity.

It is a further object of the invention to provide an inexpensive wide-dynamic range optical receiver amplifier.

It is a further object of the invention to provide a lightweight wide-dynamic range optical receiver amplifier.

It is a further object of the invention to provide a wide dynamic range optical receiver amplifier suited to implementation on thick-film and/or thin-film hybrids.

It is a further object of the present invention to provide an improved wide-dynamic range optical receiver amplifier suited to multi-quadrant spot-tracking application.

It is a further object of the invention to provide an improved front end for a spot-tracking system.

According to the invention, a wide-dynamic range optical receiver amplifier is provided by using two separate amplifiers. The first amplifier is a low-impedance input, low-noise, high-gain amplifier, preferably an amplifier having a current-mode input. An input resistor to the amplifier is provided. A light-induced signal source, (i.e., a photoconductive detector, such as a PIN diode, phototransistor, or other similar device) is connected to the input resistor such that signal current from the light-induced signal source flows through the input resistor into the first amplifier input.

A second amplifier having a very high-impedance input is connected to receive the light induced signal source, either directly or through a resistive divider network. The input impedance of the second amplifier (and the divider network, if used) is high enough that the impedance seen by the light-induced signal source remains dominated by the resistance value of the input resistor to the first amplifier for all operating conditions.

The first amplifier provides a first signal output, and the second amplifier provides a second signal output. The first amplifier provides gain, while the second amplifier is connected as a buffer amplifier, providing less gain than the first amplifier. Accordingly, the first signal output is used when the light-induced signal is "weak", or low-amplitude. The second signal output is used for higher light-induced signal amplitudes.

According to one aspect of the invention, the resistance value of the input resistor is chosen for the amplifier such that its resistance value is much greater than the input impedance of the first amplifier, and the impedance seen through (including) the input resistor towards the amplifier is dominated by the resistance value of the input resistor.

According to another aspect of the invention, resistance value of the input resistor is substantially equal to zero (a wire), thereby causing the voltage seen at the input to the second amplifier to be dominated by a logarithmic characteristic of the current-mode input of the first amplifier.

According to one aspect of the invention, there is a feedback resistor connected between the first amplifier output and the first amplifier input such that a summing junction is formed at the first amplifier input.

Under ordinary circumstances, there would be a significant discontinuity in the impedance seen by the light-induced signal source when the first (higher gain) amplifier's output saturates. This is because of the loss of a "virtual ground" provided by a summing junction. However, because of the low input impedance of the first amplifier in the present invention, the impedance seen at the light-induced signal source remains substantially unchanged (being dominated by the resistance value of the input resistor) when the first amplifier's output becomes saturated. The second amplifier, having lower gain, continues to provide an output signal better suited to high amplitude input signal levels.

According to another aspect of the invention, signal selection means, e.g., an electronic switch or relay, is connected to the first amplifier output and to the second amplifier output. A selection signal selects either the first output signal or the second output signal, and provides the selected signal at an output. This permits external (to the optical amplifier) level detection circuitry to determine whether the first amplifier output or the second amplifier output should be selected.

According to another aspect of the invention, means for summing the outputs of the first and second amplifiers are provided, thereby providing a composite "summed" output signal.

According to another aspect of the invention, the first amplifier is a transresistance (transimpedance) amplifier, having a low-impedance current-mode input and a low-impedance voltage-mode output.

Alternatively, the first amplifier is a current amplifier, having a low-impedance current-mode input and a high-impedance current-mode output.

According to another aspect of the invention, the second amplifier is a voltage amplifier, having a high-impedance voltage-mode input and a low-impedance voltage-mode output.

Alternatively, the second amplifier is a transadmittance (transconductance) amplifier, having a high-impedance voltage-mode input, and a high-impedance current-mode output.

In one embodiment of the invention there is, in addition, a resistive voltage divider dividing a voltage applied across it. The resistive voltage divider is connected between the light-induced signal source and a reference point such that it divides the light-induced signal seen at the input resistor and provides the divided voltage to the second amplifier input.

The voltage divider may be viewed as a three-terminal device which provides at its third terminal a portion of the voltage applied across its first and second terminals. This voltage divider further reduces the gain of the second amplifier relative to that of the first amplifier, further expanding the useful dynamic range of the optical receiver amplifier.

In another embodiment of the invention, there is further provided a first diode, a second diode, and a biasing resistor. The first diode is connected in a series configuration with the second diode such that the cathode of one is connected to the another of the other (this results in both diodes "pointing" in the same direction). The series combination of the first and second diodes is further connected in series between the voltage divider and the ground reference point such that the remaining end (anode or cathode) of the second diode is connected to the ground reference point and the remaining end (the "unconnected" anode or cathode) of the first diode connects to the resistive divider, providing an effective ground reference point. The biasing resistor is connected between a biasing voltage source and the connection point between the first and the second diodes such that the second diode is maintained in forward bias.

The first diode does not conduct until the light-induced signal level becomes high enough to overcome its forward diode drop. This means, that for low signal levels, no (significant) current flows through the resistive divider and the second amplifier receives the "undivided" light-induced signal. This condition remains until the first diode begins to conduct, at which point the resistive divider functions as a divider, further reducing the effective gain of the second amplifier and extending the dynamic range of the optical receiver amplifier.

Another significant effect of the diodes is that when the first diode does not conduct, the resistive divider is effectively eliminated from the input circuit of the first amplifier, eliminating with it any resistive "shot" noise that it might otherwise contribute to the first output signal.

Other embodiments are directed to application of the improved wide-dynamic range optical receiver amplifier in a front-end for a spot-tracking system.

In one such embodiment, a multi-sector photodetector providing a plurality "n" of light-induced signals on a like plurality "n" of light-induced signal lines is employed. A like plurality "n" of optical receiver amplifiers of the types described hereinabove are used, each being connected to a corresponding one of the light induced signal lines.

According to one aspect of the invention, the plurality "n" is four, corresponding to a four-quadrant spot tracking system.

Other objects, features and advantages of the invention will become apparent in light of the following description thereof.

DETAILED DESCRIPTION OF THE INVENTION

Figure 1:
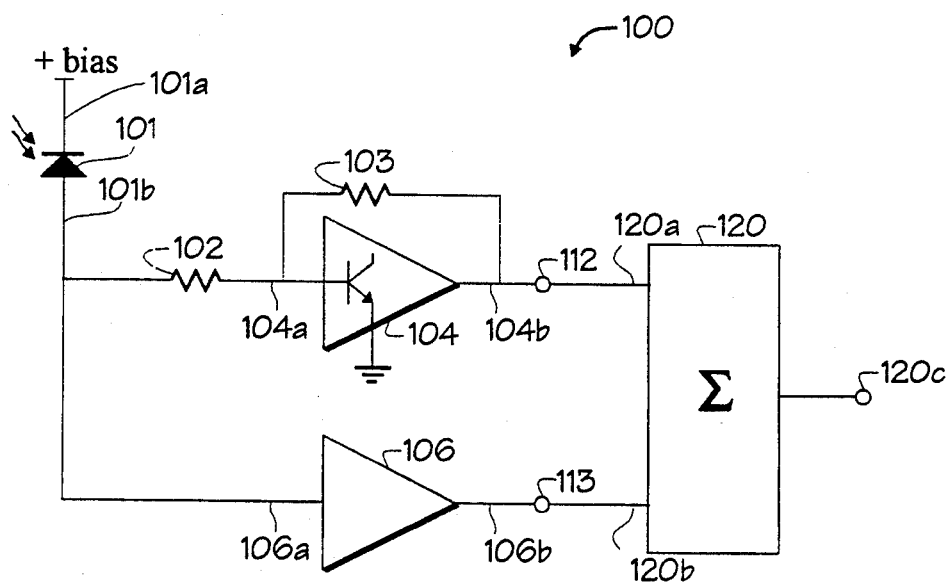
FIG. 1 is a schematic diagram of one embodiment of a wide-dynamic range optical receiver, according to the invention.

FIG. 1 is a schematic diagram of one embodiment of a wide-dynamic range optical receiver 100, according to the invention. Two amplifiers are provided: a first amplifier 104 having a very low input impedance, and a second amplifier 106 having a very high input impedance. A photoconductive detector 101 acts as the signal source for the optical receiver, and is positioned such that an incident light beam falling upon an active area of the detector will induce a signal current. Low-intensity levels of incident light on the photoconductive detector 101 induce a small signal current, while larger intensity levels induce a larger signal current. A positive terminal 101a of the photoconductive detector 101 connects to a positive bias voltage source ("+ bias" in the figure), while a negative terminal 101b of the photoconductive detector 101 connects to an input 106a of the second amplifier 106 and to a first terminal of a resistor 102. A second terminal of the resistor 102 connects to an input 104a of the first amplifier 104. The resistor 102 simultaneously provides a path for the signal current into the first amplifier 104, provides a resistive load for the signal current, and establishes a corresponding signal voltage at the input of the second amplifier 106. A signal voltage results at the negative terminal 101b of the detector 101. A feedback resistor, 103 is connected between an output 104b and the input 104a of the first amplifier 104. The first amplifier 104 has a low input impedance and the resistor 102 preferably (but not necessarily) has a resistance much greater than the input impedance of the second amplifier 104, such that the impedance seen at the negative terminal 101b of the photoconductive detector is dominated by (and is substantially equal to) the value of the resistor 102. (Some useful characteristics of the optical receiver 100 are discussed hereinbelow with respect to the special case the resistance value of the input resistor 102 does not dominate the impedance seen at the negative terminal 101b of the photodetector The output 104b of the first amplifier 104 provides a first output signal 112, and an output 106b of the second amplifier 106 provides a second output signal 113.

Preferably, the first amplifier 104 is a current-input (current-mode input) amplifier. Typically, such amplifiers have a low input impedance to a ground potential provided by a base-emitter junction of an input BJT (Bipolar Junction Transistor). The emitter of the BJT is typically connected (inside the amplifier) either directly to ground or to a virtual ground potential, and the base of the input BJT is used as the input to the amplifier. As a result, the low input impedance seen at the input to the amplifier results from the forward-biased base-emitter junction of the BJT.

The first amplifier 104 can have either a voltage-mode output (low-impedance) or a current-mode output (high-impedance). If the first amplifier 104 has a voltage-mode output 104b, then the first amplifier 104 is called a transresistance (or transimpedance) amplifier. If the first amplifier 104 has a current-mode output 104b, then the first amplifier 104 is called a current amplifier.

If the first amplifier 104 is a current amplifier and if a feedback resistor 103 is used (it is common with current amplifiers to connect the output directly to either a current mode input of a following stage of amplification or to a ground-referenced load impedance) then the transfer gain, expressed as the (AC) ratio of the voltage at the output 104b of the first amplifier 104 divided by the signal current flowing through the input resistor 102, is approximately equal to the parallel combination of the value of the feedback resistor 103 and any load impedance. The output 104b of the first amplifier 104, in this case, may be viewed as a voltage source providing a voltage equal to the product of the input current and the value of the feedback resistor 103 through a series resistance equal to the feedback resistor 103.

If the first amplifier 104 is a transresistance amplifier (having a voltage mode output) then the transfer gain of the first amplifier 104, as before, is equal to the value of the feedback resistor 104, but the output impedance is low, and relatively unaffected by load impedances.

Since the input signal from the photodetector 101 is a current and the input impedance of the second amplifier 106 is very high, the value of the input resistor 102 does not affect the signal current from the photodetector 101 to the first amplifier 104, and the gain of the first amplifier 104, therefore, is substantially independent of the value of the first resistor.

By virtue of the low input impedance presented by the input 104a of the first amplifier 104, the impedance seen at the negative terminal 101b of the photoconductive detector 101 does not change significantly when the output 104b of the first amplifier 104 saturates. In an "ordinary" amplifier made from an operational amplifier connected in a feedback amplifier configuration with a negative feedback network connected between the output and the input of the amplifier, the input of the amplifier acts as a "zero" impedance summing junction only while the output of the amplifier remains unsaturated. If the output saturates, the impedance at the input changes from a very small value (effectively zero) to a value dependent upon the configuration of the feedback network around the amplifier. Such an amplifier, when connected in an optical receiver (e.g., replacing the first amplifier 104, and resistors 102 and 103) causes a significant discontinuity in the impedance seen at the input (e.g., seen at the negative terminal 101b of the photoconductive detector 101) when its output saturates. In contrast to this, there is effectively no impedance change seen at the negative terminal 101b of the photoconductive detector 101 when the output 104b of the first amplifier 104 saturates. The elimination of such discontinuities is of paramount importance in attempting to preserve the "monotonicity" of the optical receiver amplifier. (A "monotonic" system has no regions of negative gain, i.e., the magnitude of output values consistently increases (or decreases) in response to increasing input values.)

The gain of the second amplifier 106, unlike that of the first amplifier 104, depends almost completely upon the impedance seen at the negative terminal 101b of the photodetector 101. The second amplifier 106 acts as a relatively low-gain buffer (essentially "copying" the voltage at the negative terminal 101b of the photodetector 101) and, by virtue of its high input impedance, does not significantly affect the impedance seen at the negative terminal 101b of the photoconductive detector 101.

The second amplifier 106 can have either a voltage-mode output (in which case the second amplifier 106 is a voltage amplifier) or a current-mode output (in which case the second amplifier 106 is a "transconductance" or "transadmittance" amplifier). Therefore, the overall forward voltage gain (voltage-mode output) or forward transconductance (current-mode output) of the second amplifier 106 is relatively low.

The second amplifier 106 is preferably an FET-input (Field Effect Transistor) operational amplifier or buffer amplifier, connected in a low-gain configuration (i.e., lower gain than the first amplifier 104). It is not uncommon for amplifiers of this type to have DC input impedances of up to $10^{12}$ ohms ($\Omega$), and high frequency input impedances of many megohms (1 megohm = $10^6$ $\Omega$).

Under "ordinary" circumstances, as described hereinabove, where the resistance value of the input resistor 102 dominates the impedance seen at the negative terminal 101b of the photodetector 101, the signal voltage seen at the input 106a of the second amplifier 102 is approximately equal to the product of the signal current and the value of the input resistor 102. However, if the resistance value of the second resistor is small or zero, then the input impedance at the input 104a of the first amplifier 104 becomes significant. Since the input impedance of a current input amplifier typically includes a significant contribution by a forward-biased base-emitter junction of a BJT, the base-emitter junction characteristics play a significant part in the voltage seen at input 106a of the second amplifier 106.

It is well known in the art that the current to voltage characteristic of a base-emitter junction of a BJT has a roughly logarithmic shape. (In fact, the logarithmic transfer function of collector current to base-emitter voltage is so nearly ideal for transistors with low equivalent emitter resistances that such transistors are often used as the basis of precision logarithmic amplifiers. The logarithmic nature of the base-emitter voltage to current transfer function is not nearly so ideal, but it has a similar shape.) If the resistance value of the input resistor 102 is small enough, then the logarithmic voltage conversion characteristic dominates. A logarithmic response effectively "compresses" the signal, thereby effectively extending the dynamic range of input signals for which the second amplifier operates.

A summing block 120 has two inputs 120a and 120b and an output 120c. The first input 120a connects to the output 104b of the first amplifier 104. The second input 120b connects to the output 106b of the second amplifier 106. The output 120c provides an output signal proportional to the sum of the first output signal 112 and the second output signal 113, providing input polarity conversion as necessary. In order for monotonicity of the output signal to be maintained over the complete range of signal current values, it is necessary for the "phase" (sign of the gain) of the two amplifiers 104 and 106 to be the same. When the first amplifier saturates, there is some change in the impedance seen at the detector 101, and a corresponding change in the effective gain of the optical receiver amplifier 100, but no loss of monotonicity. If the resistance value of the feedback resistor 103 is sufficiently large, then the impedance of the input 104a of the first amplifier 104 dominates, and the impedance change is not significant.

The dynamic range of the optical receiver 100 is effectively expanded by the combination of the first and second amplifiers (104 and 106, respectively). The first amplifier 104 has high gain (compared to that of the second amplifier 106) and the first output signal 112 is best suited to use for processing of small input signals. However, as signal levels increase, the output 104b of the first amplifier 104 may become saturated, in which case the second amplifier 106, with its relatively lower gain, provides additional dynamic range. The dynamic range expansion of the optical receiver 100 over that provided by a single-amplifier configuration is given by the ratio of the gain of the first amplifier 104 (i.e., from the signal at the negative terminal 101b of the photoconductive detector 101 to the first output signal 112) to the maximum useful gain of the second amplifier 106 (i.e., from the signal at the negative terminal 101b of the photoconductive detector 101 to the second output signal 113).

The two amplifier combination described hereinabove has several advantages over prior-art logarithmic amplifier or gain-switching techniques. If the value of the input resistor 102 is small (or zero), then the second amplifier 106 provides a roughly logarithmic response. But the dynamic range of the second amplifier 106 is effectively extended by the presence of the high-gain low-noise first amplifier 104, even if the second amplifier provides a logarithmic response. Further, the design of the optical receiver amplifier is considerably simpler than that of a conventional logarithmic amplifier or that of a gain-switching amplifier. Further, the substantially linear gain characteristic at low signal levels (when the first amplifier 104 dominates the output) is preferable to a logarithmic (or otherwise non-linear) response when the signal must be detected in the presence of noise.

Figure 2:
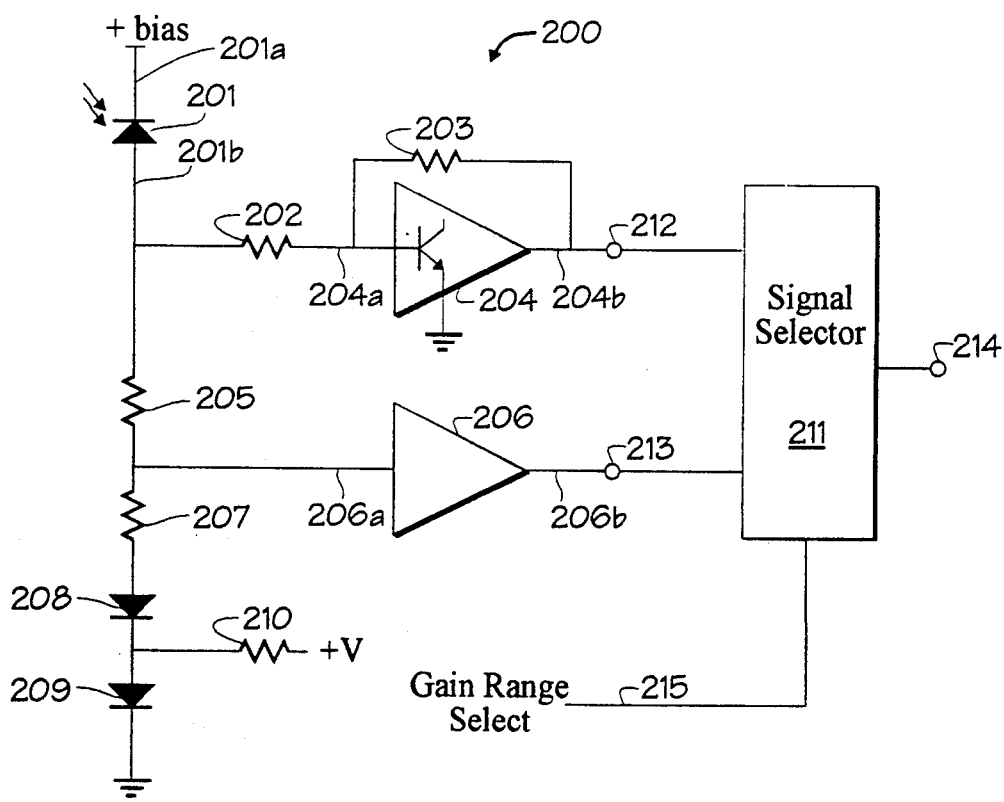
FIG. 2 is a schematic diagram of another embodiment of a wide-dynamic range optical receiver, according to the invention.

FIG. 2 is a schematic of another embodiment of an optical receiver 200, according to the invention. Similar to the embodiment of FIG. 1, a photoconductive detector 201 is connected such that its positive terminal 201a is connected to a positive bias voltage source ("+ bias" in the figure) and its negative terminal 201b provides a signal current, the level of which depends upon the intensity of light striking sensitive portions of the detector 101. A low-noise amplifier 204, (similar to 104, FIG. 1) which has a low-impedance input 204a and an output 204b, is connected such that the input 204a forms a summing junction with an input resistor 202 and a feedback resistor 203. The other end of the feedback resistor 203 connects to the output 204b of the low-noise amplifier 204, which provides a low-level signal output 212. The other end of the input resistor 202 connects to the negative terminal 201b of the photoconductive detector 201, simultaneously providing a signal path from the detector 201 into the low-noise amplifier 204 and providing a resistive load for the signal current. The low-noise amplifier 204 has a low input impedance (current-mode input) and may have either a voltage-mode output (low impedance output) or a current-mode output (high impedance output).

The negative terminal 201b of the photoconductive detector 201 further connects to one end of a first resistor 205 which forms part of a resistive divider with a second resistor 207. The other end of the first resistor 205 connects to one end of the second resistor 207 and to a high-impedance input 206a of a buffer amplifier 206. The output 206b of the buffer amplifier provides a high-level signal output 213. The other end of the second resistor connects to an anode end of a first diode 208. A cathode end of the first diode 208 further connects to one end of a third resistor 210 and to an anode end of a second diode 209. The other end of the third resistor connects to a positive voltage ("+ V" in the figure). A cathode end of the second diode is connected to a ground reference. The third resistor 210 forward biases the second diode 209, thereby generating a "diode drop" across the second diode 209. As long as the signal voltage at the negative terminal 201b of the photoconductive detector 201 is small enough that the first diode is not forward biased, no current flows through the first resistor 205 and the second resistor 207.

The resistive voltage divider formed by the first and second resistors may be viewed as a three terminal device wherein a portion of a voltage applied across the first and second terminals appears at the third terminal.

An optional signal selector 211, responsive to a gain-range select signal 215 permits electronic selection of either the low-level signal output 212 or the high-level signal output 213. The signal at the output (212 or 213) selected by the signal selector 211 appears at the output 214 of the signal selector.

In this embodiment (200) the first diode 208 is turned off by the voltage generated across the second diode 209 for small input signal levels. As a result, (and as a result of the high input impedance of the buffer amplifier 206) no current flows in the first resistor 205 and the second resistor 207, effectively eliminating them from the circuit. This helps the noise performance of the low-noise amplifier 204 by substantially eliminating any resistive "shot" noise which might otherwise be contributed by these resistors. The values of the first resistor 205 and the second resistor 207 are chosen such that the resistance value of the parallel combination of the input resistor 202 and the series combination of the first and second resistors 205 and 207 is sets the gain of the second amplifier. Preferably, but not necessarily, the series combination of the first resistor 205 and the second resistor 207 has a resistance value which is significantly greater than the resistance value of the input resistor 202, such that the impedance seen at the negative terminal 201b of the photoconductive detector 201 is dominated by the value of the input resistor 202, and does not change significantly when either the output 204b of the low-noise amplifier saturates or the first diode 208 becomes forward biased.

As the signal level at the negative terminal 201b of the photoconductive detector 201 increases, the output 204b of the low-noise amplifier 204 may saturate, and the first diode 208 becomes forward biased, causing a change in gain of the second amplifier. When no current flows through the first diode (i.e., when the input signal level is sufficiently low that the first diode is forward biased) the signal seen at the input 206a of the second amplifier is unattenuated by the resistive divider, and is controlled entirely by the impedance of the input circuit of the first amplifier 204. With the first diode 208 forward biased, the first resistor 205 and the second resistor 207 form a resistive divider, reducing the signal seen at the input 106a of the buffer amplifier 106, accordingly. This resistive divider causes permits greater dynamic range of the optical receiver 200 compared to that of the optical receiver 100 described with respect to FIG. 1 by virtue of the greater difference in effective gain between the low-noise amplifier 204 and the buffer amplifier 206, when compared to their counterparts 104 and 106, respectively, as described with respect to FIG. 1.

It should be noted that the resistive divider may be used with or without the diodes 208 and 209. If the diodes are not used, then the end of the second resistor 207 opposite the end connected to the first resistor 205 would simply be connected directly to ground (or to a fixed voltage reference).

The gain-range select signal 215 may be generated, for example, by external signal level detection, thereby selecting either the relatively higher-gain low-noise amplifier for low input signal levels or the relatively lower gain buffer amplifier for high input signal levels.

It should be understood that the signal selector 211 may also be similarly applied to the opto-receiver (optical receiver) configuration described hereinabove with respect to FIG. 1. It should also be understood that the summing block 120 of the optical receiver amplifier 100 described hereinabove with respect to FIG. 1 may be similarly applied to the optical receiver amplifier 200 described hereinabove with respect to FIG. 2.

It will be readily apparent to one of ordinary skill in the art that the present inventive technique is applicable to both pulsed and DC modes of (laser) operation. It is common practice to use a laser light source, such as a YAG laser, to generate light pulses at approximately 1.06 $\mu M$ (microns) in wavelength and approximately 20 ns (nanoseconds) in width. For DC operation, any input offset voltage of the low-noise (higher gain) amplifier (e.g., 104 or 204) may be cancelled out by using an additional differential amplifier, or by other suitable means.

In comparison with gain-switching techniques and logarithmic amplifiers, the present inventive technique is easier to design, is less subject to self-induced noise, is not subject to input impedance fluctuations and/or discontinuities, and requires relatively few components. As a result of the smaller number of components, the opto-receiver of the present invention can be made extremely small and light compared to other techniques, and is therefore ideally suited to airborne applications, wherein reduction of component weight is highly desirable and an object of prolonged endeavor.

Figure 3A:
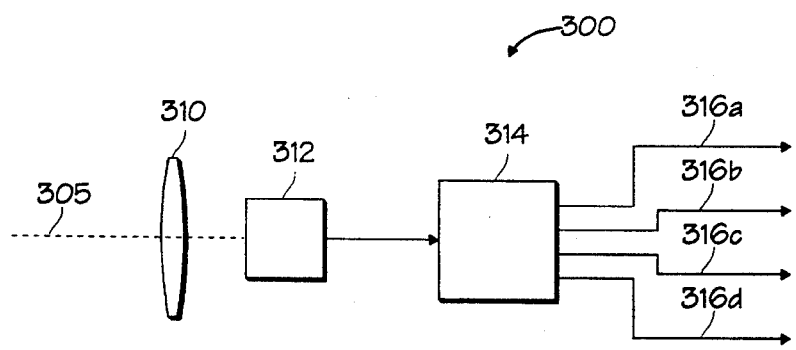
FIG. 3a is a block diagram of a front-end of a spot tracking system employing a plurality of optical receivers, according to the invention.

FIG. 3a is a block diagram of a front end 300 for a spot tracking system utilizing wide dynamic range optical receivers of the type described hereinabove (e.g., 100, 200). In a spot-tracking system, a bright spot of light, e.g., a laser-generated spot, is focused on a target. Reflected light 305 from the target is imaged by an optical system 310 (e.g., a lens) onto a multi-sector photodetector 312 (described hereinbelow with respect to FIG. 3b). Signals from the multi-sector photodetector 312 are amplified by opto-receiver electronics 314 to provide a number (four shown) of sector (quadrant) output signals 316a, 316b, 316c, and 316d. In a spot tracking system, these signals are used to determine the position of the target relative to the orientation of the photodetector 312, and to provide guidance or steering signals to "aim" the photodetector 312 (or the device upon which it is mounted) more accurately towards the spot on the target.

Figure 3B:
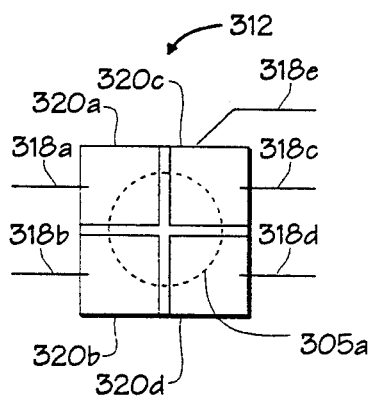
FIG. 3b is a diagrammatic view of a four-quadrant photodiode assembly used in a spot-tracking system.

FIG. 3b is a view of a four-quadrant multi-sector photodiode assembly 312 for use in a spot-tracking system such as that described with respect to FIG. 3a. The photodiode assembly 312 has an array of four distinct photosensitive areas (quadrants or sectors) 320a, 320b, 320c, and 320d. Each sector 320a, 320b, 320c, and 320d, has a first electrical connection 318a, 318b, 318c, and 318d, respectively. Second electrical connections to the each of the photo-sensitive areas are connected in common and provided as a single electrical connection 318e. The sensitive areas 320a, 320b, 320c, and 320d operate independently as separate photodiodes, each responding only to light impinging thereupon. Dashed line 305a indicates the effect of a perfectly centered spot illuminating each of the sensitive areas 320a, 320b, 320c, and 320d, equally.

It will readily be appreciated by one of ordinary skill in the art that although the four-quadrant photodiode assembly 312 shows four diodes connected in a common-cathode configuration, that multi-sector photodiode assemblies can also be fabricated in a common-anode configuration, as discrete sector diodes, and with any number of sensitive areas. It is within the scope and spirit of the present invention to adapt any such single or multi-sector configuration of photodiodes for use with opto-receivers of the type described hereinabove with respect to FIGS. 1 and 2.

Figure 3C:
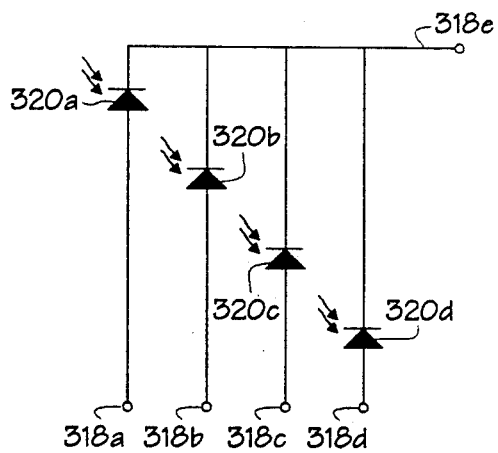
FIG. 3c is a schematic equivalent of the four-quadrant photodiode assembly of FIG. 3b.

FIG. 3c is a schematic representation of the four quadrant photodiode 312 of FIG. 3b, wherein the four sensitive areas 320a, 320b, 320c, and 320d are represented graphically as four separate photodiodes with a common connection (318e).

Figure 3D:
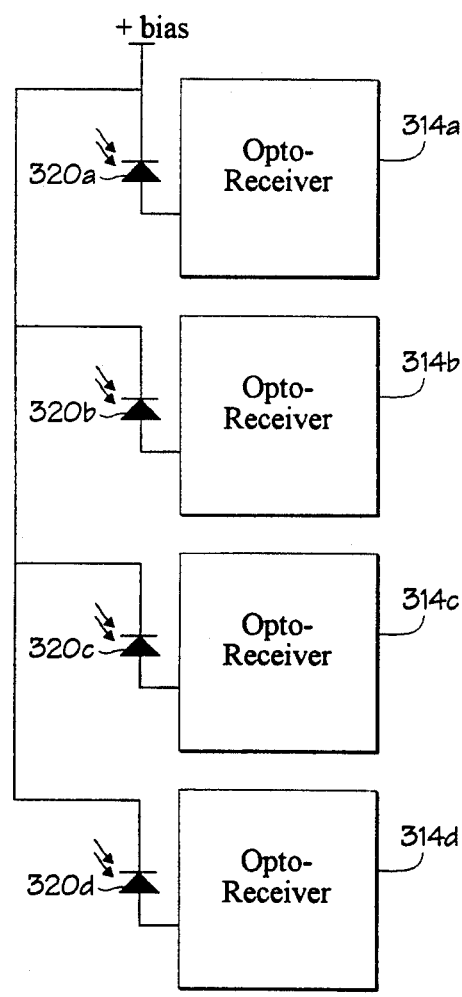
FIG. 3d is a block diagram of a front end of a four-quadrant spot-tracking system utilizing four optical receivers, according to the invention.

FIG. 3d is a block diagram of a four-quadrant optical receiver system for use with a spot tracking system, according to the invention. (This figure corresponds roughly to the combination of 312 and 314 as described with respect to FIG. 3a.) In the figure, a four quadrant photodiode assembly is connected such that one sensitive area 320a, 320b, 320c, and 320d is connected to each of four opto-receivers 314a, 314b, 314c, and 314d, respectively. These opto-receivers 314a, 314b, 314c, and 314d are built according to the present inventive technique (e.g., 100—FIG. 1, or 200—FIG. 2).

While FIGS. 3a-d describe a "front-end" for a spot tracking system using a four-quadrant photodetector (the four quadrant photodiode 312), it will be readily appreciated by one of ordinary skill in the art that similar spot tracking systems are possible utilizing multi-sector detectors with two or more sensitive areas and a like number of opto-receiver amplifiers of the type described hereinabove. Where only linear tracking (one dimensional, e.g., up-down or left-right) is required, a "two-channel" system may be constructed using a two-sector photo-detector and two opto-receiver amplifiers (e.g., 100—FIG. 1 or 200—FIG. 2). A two dimensional (i.e., "X" and "Y") spot tracking system can be constructed using a multi-sector photo-detector having three or more non-collinear sensitive areas and a like number of opto-receiver amplifiers.

It will also be readily appreciated by one of ordinary skill in the art that the photoconductive detectors described hereinabove (e.g., 101, 201, 312) may be provided by photodiodes (e.g. PIN diodes), phototransistors, or any other suitable photodetector device and that with an appropriate reversal of polarities, the principles of the present invention may be readily applied to negatively referenced or ground-referenced photodetectors. Accordingly, it should be recognized that the circuits described hereinabove are merely exemplary of physical configurations of this type and should not be considered as limiting the scope of the invention.

It should be further understood that while purely resistive input, feedback and divider components are shown and described hereinabove with respect to the first and second amplifiers of the optical receiver amplifier, that it is within the scope and spirit of the present invention to provide "compound" input, feedback or divider components composed of resistors, capacitors, and/or inductors to accomplish similar results.

What is claimed is:

1. An optical receiver amplifier consisting essentially of:
   means for providing a light-induced signal on a signal input line;
   a first amplifier including a first amplifier input having a low impedance value (R1), and including a first amplifier output providing a first output signal;
   an input resistor connected between the signal input line and the first amplifier input and providing the light-induced signal to the first amplifier input, said input resistor having a resistance value (R2); and
   a second amplifier including a second amplifier input having a high impedance value (R3) greater than the resistance value (R2) of the input resistor, the second amplifier input connected to the signal input line, and including a second amplifier output providing a second output signal.

2. An optical receiver amplifier according to claim 6, wherein:
   the resistance value (R2) of the input resistor is greater than the impedance value (R1) of the first amplifier input.

3. An optical receiver amplifier according to claim 6, wherein:
   the resistance value (R2) of the input resistor is substantially equal to zero.

4. An optical receiver amplifier according to claim 6, wherein:
   the second amplifier input is connected to the signal input line.

5. An optical receiver amplifier according to claim 6, further comprising;
   a feedback resistor connected between the first amplifier output and the first amplifier input such that a summing junction is formed at the first amplifier input.

6. An optical receiver amplifier comprising:
   means for providing a light-induced signal on a signal input line;
   a first amplifier including a first amplifier input having a low impedance value (R1), and including a first amplifier output providing a first output signal;
   an input resistor connected between the signal input line and the first amplifier input and providing the light-induced signal to the first amplifier input, said input resistor having a resistance value (R2);
   a second amplifier including a second amplifier input having a high impedance value (R3) greater than the resistance value (R2) of the input resistor, the second amplifier input receiving the light-induced signal, and including a second amplifier output providing a second output signal;
   means for providing a selection signal; and
   signal selection means, connected to the first amplifier output and to the second amplifier output and responsive to the selection signal, for selecting either the first output signal or the second output signal as a selected signal, and providing the selected signal at an output thereof.

7. An optical receiver amplifier comprising;
   means for providing a light-induced signal on a signal input line;
   a first amplifier including a first amplifier input having a low impedance value (R1), and including a fist amplifier output providing a first output signal;
   an input resistor connected between the signal input line and the first amplifier input and providing the light-induced signal to the first amplifier input, said input resistor having a resistance value (R2);
   a second amplifier including a second amplifier input having a high impedance value (R3) greater than the resistance value (R2) of the input resistor, the second amplifier input receiving the light-induced signal, and including a second amplifier output providing a second output signal; and
   summing means for summing the first output signal and the second output signal, said summing means providing a sum output signal corresponding to the sum of the first output signal and the second output signal.

8. An optical receiver amplifier according to claim 6, wherein:
   the first amplifier is a transresistance amplifier,
   the first amplifier input is a low-impedance current-mode input, and
   the first amplifier output is a low-impedance voltage-mode output.

9. An optical receiver amplifier according to claim 6, wherein:
   the first amplifier is a current amplifier,
   the first amplifier input is a low-impedance current-mode input, and
   the first amplifier output is a high-impedance current-mode output.

10. An optical receiver amplifier according to claim 6, wherein:
    the second amplifier is a voltage amplifier,
    the second amplifier input is a high-impedance voltage-mode input, and
    the second amplifier output is a low-impedance voltage-mode output.

11. An optical receiver amplifier according to claim 6, wherein:
    the second amplifier is a transadmittance amplifier, the second amplifier input is a high-impedance voltage-mode input, and the second amplifier output is a high-impedance current-mode output.

12. An optical receiver amplifier, comprising:
means for providing a light-induced signal on a signal input line;
a first amplifier including a first amplifier input having a low impedance value (R1), and including a first amplifier output providing a first output signal;
an input resistor connected between the signal input line and the first amplifier input and providing the light-induced signal to the first amplifier input, said input resistor having a resistance value (R2);
a second amplifier including a second amplifier input having a high impedance value (R3) greater than the resistance value (R2) of the input resistor, the second amplifier input receiving the light-induced signal, and including a second amplifier output providing a second output signal;
a ground reference point; and
a resistive voltage divider having a first terminal, a second terminal and a third terminal, the third terminal dividing a signal voltage applied across the first and second terminals;
wherein:
the second amplifier input is connected to third terminal of the resistive voltage divider;
the first terminal of the resistive voltage divider is connected to the signal input line; and
the third terminal of the resistive voltage divider is connected to the ground reference point.

13. An optical receiver amplifier, comprising:
means for providing a light-induced signal on a signal input line;
a first amplifier including a first amplifier input having a low impedance value (R1), and including a first amplifier output providing a first output signal;
an input resistor connected between the signal input line and the first amplifier input and providing the light-induced signal to the first amplifier input, said input resistor having a resistance value (R2);
a second amplifier including a second amplifier input having a high impedance value (R3) greater than the resistance value (R2) of the input resistor, the second amplifier input receiving the light-induced signal, and including a second amplifier output providing a second output signal;
a ground reference point;
a resistive voltage divider having a fist terminal, a second terminal and a third terminal, the third terminal dividing a signal voltage applied across the first and second terminals;
a first diode and a second diode, each having an anode terminal and a cathode terminal, the first and second diodes connected in series with one another such that the anode terminal of one of the first and second diodes is connected to the cathode terminal of the other of the first and second diodes at an anode-to-cathode connection point; and
a biasing resistor connected between a voltage source providing a biasing voltage and the anode-to-cathode connection point of the first and second diodes
wherein:
the second amplifier input is connected to third terminal of the resistive voltage divider;
the first terminal of the resistive voltage divider is connected to the signal input line;

the third terminal of the resistive voltage divider is connected to the terminal of the first diode which is opposite the anode-to-cathode connection point;
the ground reference point is connected to the terminal of the second diode which is opposite the anode-to-cathode connection point; and
the biasing voltage is of sufficient magnitude to maintain the second diode in forward bias.

14. An optical receiver amplifier according to claim 13, further comprising:
a feedback resistor connected between the first amplifier output and the first amplifier input such that a summing junction is formed at the first amplifier input.

15. An optical receiver amplifier according to claim 12, further comprising:
a feedback resistor connected between the first amplifier output and the first amplifier input such that a summing junction is formed at the first amplifier input.

16. A front-end for a spot-tracking system, comprising:
a multi-sector photodetector providing a plurality "n" of light-induced signals on a like plurality "n" of light-induced signal lines;
a like plurality "n" of optical receiver amplifiers, each optical receiver amplifier having a signal input line, a first output signal and a second output signal, each signal input line being connected to a corresponding one of the light-induced signal lines, and each optical receiver amplifier consisting essentially of:
a first amplifier including a first amplifier input having a low impedance value (R1), and including a first amplifier output providing the first output signal;
an input resistor connected between the signal input line and the first amplifier input and providing the light-induced signal to the first amplifier input, said input resistor having a resistance value (R2); and
a second amplifier including a second amplifier input having a high impedance value (R3) greater than the resistance value (R2) of the input resistor, the second amplifier input connected to the signal input line, and including a second amplifier output providing the second output signal.

17. A front-end for a spot-tracking system according to claim 20, wherein:
the resistance value (R2) of the input resistor is greater than the impedance value (R1) of the first amplifier input.

18. A front-end for a spot-tracking system according to claim 20, wherein:
the resistance value (R2) of the input resistor is substantially equal to zero.

19. A front-end for a spot-tracking system according to claim 20, wherein:
the second amplifier input is connected to the signal input line.

20. A front-end for a spot-tracking system, comprising:
a multi-sector photodetector providing a plurality "n" of light-induced signals on a like plurality "n" of light-induced signal lines;

a like plurality "n" of optical receiver amplifiers, each optical receiver amplifier having a signal input line, a first output signal and a second output signal, each signal input line being connected to a corresponding one of the light-induced signal lines, and each optical receiver amplifier comprising;

a first amplifier including a first amplifier input having a low impedance value (R1), and including a first amplifier output providing the first output signal;

an input resistor connected between the signal input line and the first amplifier input and providing the light-induced signal to the first amplifier input, said input resistor having a resistance value (R2);

a second amplifier including a second amplifier input having a high impedance value (R3) greater than the resistance value (R2) of the input resistor, the second amplifier input receiving the light-induced signal, and including a second amplifier output providing the second output signal; and summing means for summing the first output signal and the second output signal, said summing means providing a sum output signal corresponding to the sum of the first output signal and the second output signal.

21. A front-end for a spot-tracking system, comprising:

a multi-sector photodetector providing a plurality "n" of light-induced signals on a like plurality "n" of light-induced signal lines;

a like plurality "n" of optical receiver amplifiers, each optical receiver amplifier having a signal input line, a first output signal and a second output signal, each signal input line being connected to a corresponding one of the light-induced signal lines, and each optical receiver amplifier comprising a first amplifier including a first amplifier input having a low impedance value (R1), and including a first amplifier output providing the first output signal;

an input resistor connected between the signal input line and the first amplifier input and providing the light-induced signal to the first amplifier input, said input resistor having a resistance value (R2);

a second amplifier including a second amplifier input having a high impedance value (R3) greater than the resistance value (R2) of the input resistor, the second amplifier input receiving the light-induced signal, and including a second amplifier output providing the second output signal;

a ground reference point; and a resistive voltage divider having a first terminal, a second terminal and a third terminal, the third terminal dividing a voltage applied across the first and second terminals;

wherein:

the second amplifier input is connected to third terminal of the resistive voltage divider;

the first terminal of the resistive voltage divider is connected to the signal input line; and the third terminal of the resistive voltage divider is connected to the ground reference point.

22. A front-end for a spot-tracking system, comprising:

a multi-sector photodetector providing a plurality "n" of light-induced signals on a like plurality "n" of light-induced signal lines;

a like plurality "n" of optical receiver amplifiers, each optical receiver amplifier having a signal input line, a first output signal and a second output signal, each signal input lie being connected to a corresponding one of the light-induced signal lines, and each optical receiver amplifier comprising a first amplifier including a first amplifier input having a low impedance value (R1), and including a first amplifier output providing the first output signal;

an input resistor connected between the signal input line and the first amplifier input and providing the light-induced signal to the first amplifier input, said input resistor having a resistance value (R2);

a second amplifier including a second amplifier input having a high impedance value (R3) greater than the resistance value (R2) of the input resistor, the second amplifier input receiving the light-induced signal, and including a second amplifier output providing the second output signal;

a ground reference point;

a resistive voltage divider having a first terminal, a second terminal and a third terminal, the third terminal dividing a voltage applied across the first and second terminals;

a first diode and a second diode, each having an anode terminal and a cathode terminal, the first and second diodes connected in series with one another such that the anode terminal of one of the first and second diodes is connected to the cathode terminal of the other of the first and second diodes at an anode-to-cathode connection point; and a biasing resistor connected between a voltage source providing a biasing voltage and the anode-to-cathode connection point of the first and second diodes;

wherein:

the second amplifier input is connected to third terminal of the resistive voltage divider;

the first terminal of the resistive voltage divider is connected to the signal input line;

the third terminal of the resistive voltage divider is connected to the terminal of the first diode which is opposite the anode-to-cathode connection point;

the ground reference point is connected to the terminal of the second diode which is opposite the anode-to-cathode connection point; and the biasing voltage is of sufficient magnitude to maintain the second diode in forward bias.

23. A front-end for a spot-tracking system according to claim 20, each optical receiver amplifier further comprising:

a feedback resistor connected between the first amplifier output and the first amplifier input such that a summing junction is formed at the first amplifier input.

24. A front-end for a spot-tracking system according to claim 20, wherein:

the plurality "n" is four.

25. A front-end for a spot-tracking system according to claim 21, wherein:

the resistance value (R2) of the input resistor is greater than the impedance value (R1) of the first amplifier input.

26. A front-end for a spot-tracking system according to claim 21, wherein
the resistance value (R2) of the input resistor is substantially equal to zero.

27. A front-end for a spot-tracking system according to claim 21, wherein:
the second amplifier input is connected to the signal input line.

28. A front-end for a spot-tracking system according to claim 21, each optical receiver amplifier further comprising;
a feedback resistor connected between the first amplifier output and the first amplifier input such that a summing junction is formed at the first amplifier input.

29. A front-end for a spot-tracing system according to claim 21, wherein:
the plurality "n" is four.

30. A front-end for a spot-tracking system according to claim 22, wherein:
the resistance value (R2) of the input resistor is greater than the impedance value (R1) of the first amplifier input.

31. A front-end for a spot-tracking system according to claim 22, wherein:
the resistance value (R2) of the input resistor is substantially equal to zero.

32. A front-end for a spot-tracking system according to claim 22, wherein:
the second amplifier input is connected to the signal input line.

33. A front-end for a spot-tracking system according to claim 22, each optical receiver amplifier further comprising:
a feedback resistor connected between the first amplifier output and the first amplifier input such that a summing junction is formed at the first amplifier input.

34. A front-end for a spot-tracking system according to claim 22, wherein:
the plurality of "n" is four.

35. An optical receiver amplifier according to claim 7, wherein:
the resistance value (R2) of the input resistor is greater than the impedance value (R1) of the first amplifier input.

36. An optical receiver amplifier according to claim 7, wherein:
the resistance value (R2) of the input resistor is substantially equal to zero.

37. An optical receiver amplifier according to claim 7, wherein:
the second amplifier input is connected to the signal input line.

38. An optical receiver amplifier according to claim 7, further comprising:
a feedback resistor connected between the first amplifier output and the first amplifier input such that a summing junction is formed at the first amplifier input.

39. An optical receiver amplifier according to claim 7, wherein:
the first amplifier is a transresistance amplifier,
the first amplifier input is a low-impedance current-mode input, and
the first amplifier output is a low-impedance voltage-mode output.

40. An optical receiver amplifier according to claim 7, wherein:
the first amplifier is a current amplifier,
the first amplifier input is a low-impedance current-mode input, and
the first amplifier output is a high-impedance current-mode output.

41. An optical receiver amplifier according to claim 7, wherein;
the second amplifier is a voltage amplifier,
the second amplifier input is a high-impedance voltage-mode output.

42. An optical receiver amplifier according to claim 7, wherein:
the second amplifier is a transadmittance amplifier,
the second amplifier input is a high-impedance voltage-mode input, and
the second amplifier output is a high-impedance current-mode output.

* * * * *